United States Patent
Doig et al.

(10) Patent No.: US 7,761,248 B2
(45) Date of Patent: ***Jul. 20, 2010

(54) METHOD AND APPARATUS FOR LEGACY COMPARISON

(76) Inventors: Paul E. Doig, 1019 Clare Street, Victoria, B.C. (CA) V8S 4B5; Martin A. Hancock, 1241 Pearce Crescent, Victoria, B.C. (CA) V8X 3S8; Colin N. Gunn, 2771 Vantilburg Crescent, Victoria, B.C. (CA) V9B 3K5; J. Bradford Forth, 2088 Loren Terrace, Victoria, B.C. (CA) V8S 2H9; Peter C. Cowan, 841 Canterbury Road, Victoria, B.C. (CA) V8X 3E5; Simon H. Lightbody, 6509 Central Saanich Rd., Victoria, B.C. (CA) V8Z 5T9

( * ) Notice: Subject to any disclaimer, the term of this patent is extended or adjusted under 35 U.S.C. 154(b) by 246 days.

This patent is subject to a terminal disclaimer.

(21) Appl. No.: 11/981,172

(22) Filed: Oct. 31, 2007

(65) Prior Publication Data

US 2008/0065335 A1 Mar. 13, 2008

Related U.S. Application Data

(63) Continuation of application No. 10/877,742, filed on Jun. 25, 2004, now Pat. No. 7,337,080.

(51) Int. Cl.
*G01R 21/00* (2006.01)
(52) U.S. Cl. ...................................... 702/61
(58) Field of Classification Search .............. 702/61, 702/60, 59; 340/870.07, 870.27; 323/211
See application file for complete search history.

(56) References Cited

U.S. PATENT DOCUMENTS

| | | | | |
|---|---|---|---|---|
| 4,829,298 | A * | 5/1989 | Fernandes | 340/870.27 |
| 4,904,996 | A * | 2/1990 | Fernandes | 340/870.07 |
| 5,539,651 | A * | 7/1996 | Zabar et al. | 702/60 |
| 6,477,475 | B1 * | 11/2002 | Takaoka et al. | 702/59 |
| 2004/0164718 | A1 * | 8/2004 | McDaniel et al. | 323/211 |

* cited by examiner

*Primary Examiner*—Tung S Lau
*Assistant Examiner*—Xiuquin Sun

(57) ABSTRACT

A line device monitors at least one power parameter of an electric power line and produces at least one representation thereof. The at least one representation is communicated to a microprocessor based device. The representation is compared with a measurement of the at least one power parameter produced by legacy instrumentation.

24 Claims, 3 Drawing Sheets

METHOD AND APPARATUS FOR LEGACY COMPARISON

CROSS-REFERENCE TO RELATED APPLICATIONS

This application is a continuation under 37 C.F.R. §1.53(b) of U.S. application Ser. No. 10/877,742, filed Jun. 25, 2004, granted as U.S. Pat. No. 7,337,080.

FIELD OF THE INVENTION

The present invention relates to systems and methods for measuring a power parameter on a high voltage power line. More particularly, the present invention relates to systems and methods for improving the accuracy of measurement of power parameters on a high voltage power line including compensating for inaccuracies in the output of instrument transformers designed for connection to power lines of 10 kV or higher.

BACKGROUND OF THE INVENTION

Instrument transformers for installation on high voltage power lines, which may include those transformers used for protective relaying and metering, are large and expensive. This is especially true at higher power line voltages. For instance, instrument transformers for installation on 230 kV lines may cost more than $100,000 US each. Replacement of instrument transformers is thus very costly in terms of capital costs. It is also very costly to replace instrument transformers due to the necessity to power down the power line while doing so. The large size of the instrument transformers also means that installation/removal and transportation costs are high.

It is quite common in legacy installations (such as at a substation) that the only instrument transformers that are installed are those used for protective relaying. These instrument transformers are typically designed to operate during large fault currents or voltages and are therefore not optimized for accuracy at normal currents and voltages. For example a relaying current transformer may have a large magnetic core and high core losses.

When instrument transformers optimized for metering applications are provided in an installation, they may be subject to degradation in accuracy over time. This may be due to magnetization from surge voltages or currents, insulation breakdown, degradation due to environmental stresses, etc.

It is therefore common in legacy installations to have inaccuracies in the measurement of voltage, current and therefore power flow due to the degradation and/or inherent inaccuracy of the installed instrumentation.

BRIEF SUMMARY

The present invention is defined by the following claims, and nothing in this section should be taken as a limitation on those claims. By way of introduction, the preferred embodiments described below relate to systems and methods for measuring power parameters of a power line and more particularly to systems and methods for improving the accuracy of or correcting the measurements of power parameters monitored by legacy instrumentation.

One embodiment includes a method of improving the accuracy of measurement of a power parameter of an electric power line. The method includes attaching a sensor to an electric power line. The method monitors at least one parameter with the sensor and produces at least one digital representation thereof. The method transmits a data packet containing at least the digital representation to a microprocessor based device. The method compares the digital representation to a measurement of the parameter produced by legacy instrumentation and produces compensation data operative to be applied to the measurement of the parameter by the legacy instrumentation. The method applies the compensation data to future measurements of the parameter made by the legacy instrumentation.

In another embodiment where legacy instrumentation monitors at least one power parameter of a power line, a system for improving the accuracy of measurements of the least one power parameter monitored by the legacy instrumentation comprises a line mounted device operative to couple to a power line and monitor at least one power parameter of the power line. The system also includes a microprocessor based device coupled to legacy instrumentation and to the line mounted device. The microprocessor based device is operative to receive an indication of the at least one power parameter from the line mounted device and the legacy instrumentation and the microprocessor based device produces compensation data to correct an inaccuracy of measurement of the at least one power parameter by the legacy instrumentation. The line mounted device includes a sensor operative to interface with the power line and produce at least one data indicative of the at least one power parameter. The line mounted device also includes a processor coupled with the sensor and operative to produce the indication of the at least one power parameter from the at least one data and wireless communication circuitry coupled with the processor and operative to transmit the indication of the at least one power parameter to the microprocessor based device.

In another embodiment, a device for attachment to a high voltage power line and facilitating improvement in monitoring of the high voltage power line by legacy instrumentation includes a sensor operative to couple with the power line and produce at least one digital representation of a power parameter of the power line. The device further includes a processor coupled to the sensor and operative to receive the at least one digital representation and produce at least one modified representation thereof. Communication circuitry is coupled to the processor and is operative to wirelessly transmit the at least one modified digital representation to a microprocessor based device. The microprocessor based device is operative to couple to the legacy instrumentation and provide compensation data to the legacy instrumentation based on the at least one modified digital representation and readings of the at least one power parameter from the legacy instrumentation.

In another embodiment, a method for compensating measurements of power parameters taken by legacy instrumentation comprises receiving first data from a sensing device that is coupled to a power line, the first data corresponding to at least one power parameter of the power line. The method also receives second data from legacy instrumentation, the second data corresponding to the at least one power parameter of the power line. The method compares the first data with the second data to produce compensation data and, for new data received from the legacy instrumentation that corresponds to the at least one parameter of the power line, corrects the new data using the compensation data.

In another embodiment, a system for correcting measurements of a power parameter of a power line monitored by legacy instrumentation comprises a sensor operable to be attached to a power line by hot-sticking the sensor to the power line. The sensor generates a representation of a power parameter of the power line. In the system, a processor is coupled to the sensor and the processor receives the representation of the power parameter from the sensor and generates a modified representation of the power parameter. A microprocessor based device receives the modified representation of the power parameter through a communication circuit connected to the processor and receives a second representation of the power parameter from a legacy instrumentation. The microprocessor based device compares the modified representation with the second representation of the power parameter to generate compensation data used correct at least the second representation of the power parameter.

Further aspects and advantages of the invention are discussed below in conjunction with the preferred embodiments.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DESCRIPTION OF A PREFERRED EMBODIMENTS

Herein, the phrase "coupled with" is defined to mean directly connected to or indirectly connected through one or more intermediate components. Such intermediate components may include both hardware and software based components. Further, to clarify the use in the pending claims and to hereby provide notice to the public, the phrases "at least one of <A>, <B>, . . . and <N>" or "at least one of <A>, <B>, . . . <N>, or combinations thereof" are defined by the Applicant in the broadest sense, superceding any other implied definitions herebefore or hereinafter unless expressly asserted by the Applicant to the contrary, to mean one or more elements selected from the group comprising A, B, . . . and N, that is to say, any combination of one or more of the elements A, B, . . . or N including any one element alone or in combination with one or more of the other elements which may also include, in combination, additional elements not listed.

Examples of the present invention provide systems and methods for improving the accuracy of monitoring of voltage, current and power flowing in power lines. These power lines typically include three-phase transmission and distribution lines of 10 kV and up. One embodiment of an apparatus includes a line mounted device that can be temporarily or permanently attached to a power line. The line mounted device may be mounted to a transmission conductor, bus bar, jumper, or any other conductor carrying the voltage and/or current of the power line as appropriate. The line mounted device measures at least one of voltage, current and power flowing in the power line. The apparatus further includes a microprocessor device capable of comparing the output of the line mounted device with the output of the legacy instrumentation, which is already installed and monitoring the power line. The microprocessor based device is further operative to produce an output that is usable to compensate the output of the existing legacy instrumentation such that after the line mounted device is removed from the power line, accurate measurement of voltage, current and/or power is still possible with the legacy instrumentation. The microprocessor based device may be a computer, computing device, and/or IED such as an existing digital power meter, protective relay, etc., that is capable of receiving communication from the sensor.

One implementation of the sensor may be the HVTLAD described in U.S. patent application Ser. No. 10/774,088 entitled "BODY CAPACITANCE ELECTRIC FIELD POWERED DEVICE FOR HIGH VOLTAGE LINES" which is incorporated by reference herein. Alternatively, the sensor may be powered by current flow in the power line, a battery, solar power, or other energy source.

Figure 1:
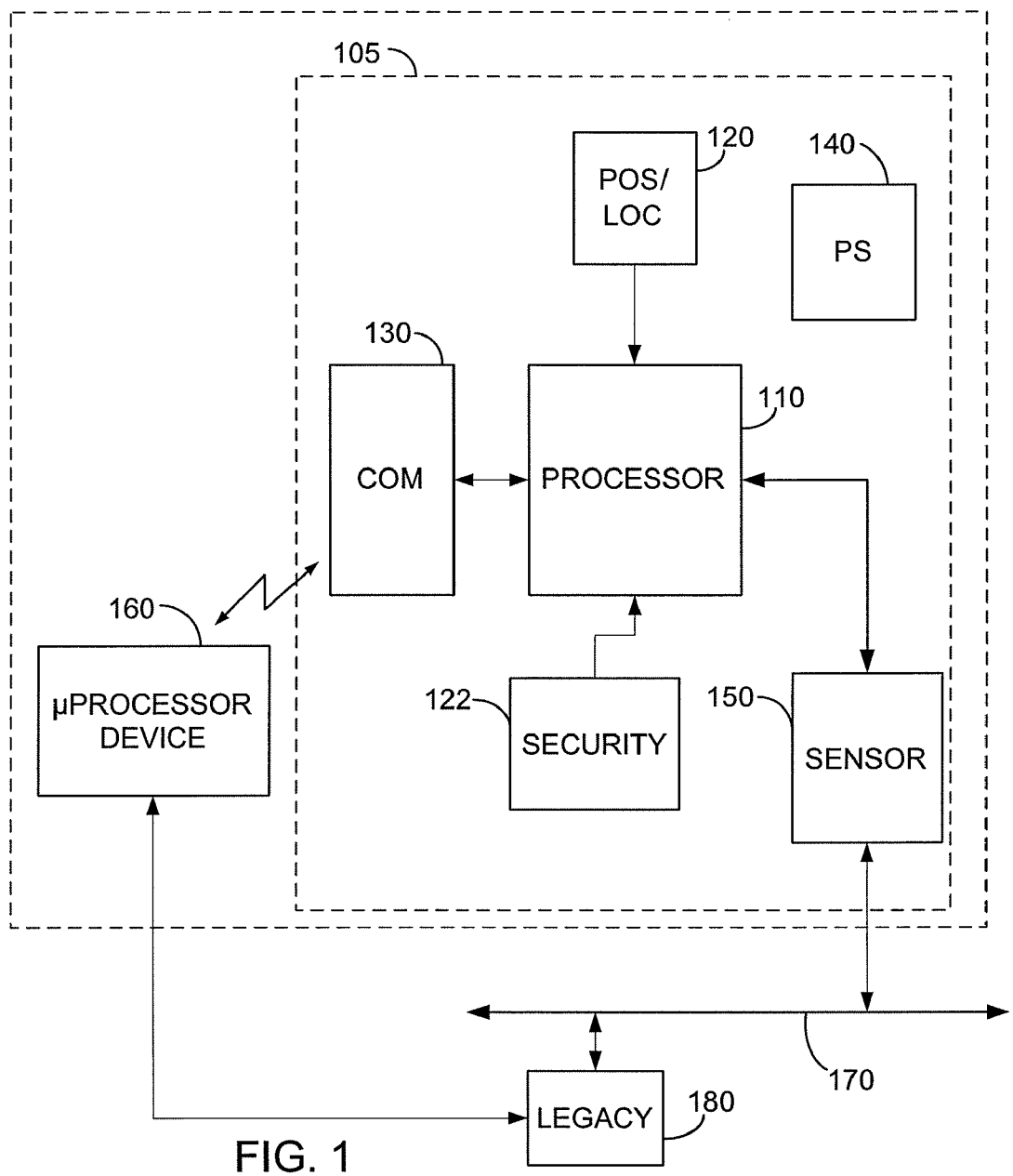
FIG. 1 depicts a block diagram of one embodiment of the apparatus in accordance with the present invention.

FIG. 1 shows a reclassification apparatus 100. The reclassification apparatus 100 includes a line mounted device 105. The line mounted device 105 is operative to be coupled to a power line 170. A sensor 150 within the line mounted device 105 senses at least one of voltage, current and power flowing in the power line 170. The sensor 150 may comprise appropriate amplifiers, circuitry, analog to digital converters, etc., to produce a digital representation of the voltage, current, and/or power flowing in the power line 170. A processor 110 couples to the sensor 150 and is operative to receive this digital representation of the voltage, current, and/or power. The processor 110 may perform calibration, rms calculations, compensations, phase calculations, etc., on the digital representation to produce modified digital representations. The modified digital representations are communicated via communication circuitry 130 to a microprocessor based device 160. The communications pathway between the communication circuitry 130 and the microprocessor device 160 may be a wireless link such as Bluetooth®, wireless telephone, or other radio frequency wireless links.

In the process of generating the modified digital representations, the processor 110 may include position and or time information provided by time/position circuitry 120. The time/position circuitry 120 may be, for example, a global positioning satellite (GPS) receiver that determines accurate time and position using global positioning satellites. The time/position circuitry may also be comprised within communications circuitry 130 such as wireless telephone circuitry.

The line mounted device 105 comprises a power source 140 to provide operating power to the circuitry within the line mounted device 105. As described above, the power source 140 may derive power from a body capacitance coupled to the power line 170, a battery or other appropriate power source.

Legacy instrumentation 180 also couples to the power line 170. The legacy instrumentation may comprise current transformer(s), voltage transformer(s), power meter(s), protective relay(s), etc. The legacy instrumentation 180 produces output or readings (including measurements of voltage, current, and/or power in the power line 170) that may be in error due to age, deterioration, operating range, etc., of the legacy instrumentation 180 as described above. At least the metering portion of the legacy instrumentation 180 may be comprised within the microprocessor based device 160.

Figure 2:
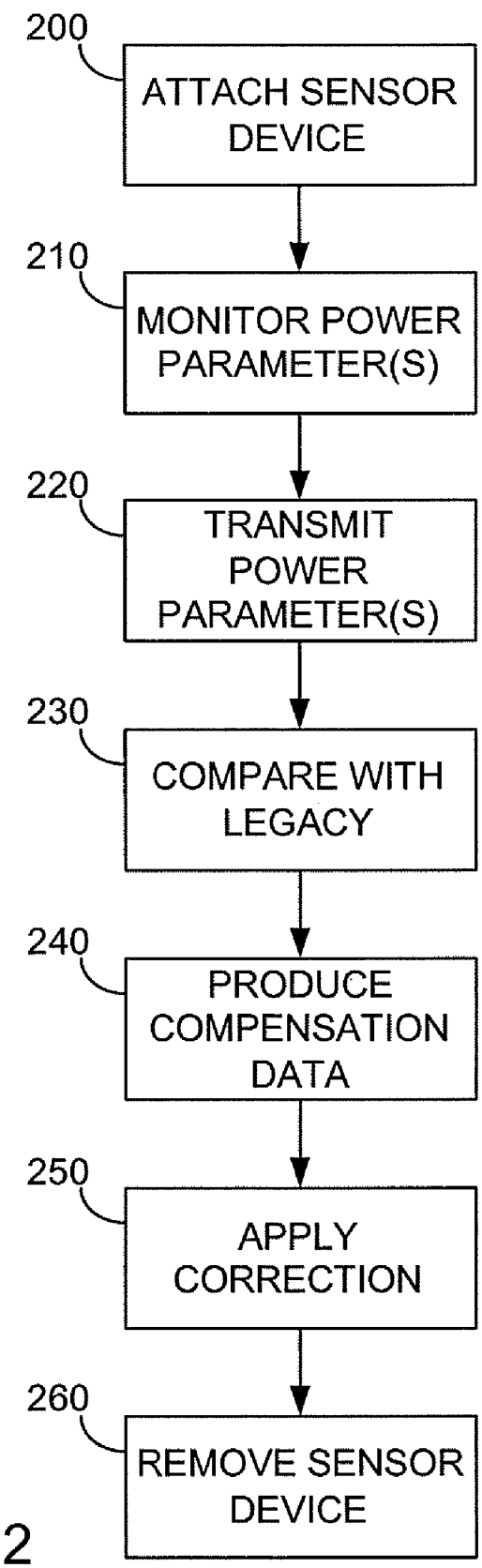
FIG. 2 depicts a flow diagram of an exemplary method of improving accuracy of legacy instrumentation.

FIG. 2 shows an exemplary method for using the reclassification apparatus 100 to improve the accuracy of readings from the legacy instrumentation 180. The line mounted device 105 is attached to the power line 170 (block 200). This may be done by "hot-sticking" the line mounted device 105 to the power line 170 while the power line 170 is live or by other appropriate methods. In order to facilitate the "hot-sticking"

method, the line mounted device 105 may be of "clamp-on" variety where for instance any current transformers within the line mounted device 105 have a split core allowing the reclassification apparatus to be clamped around the power line 170. The line mounted device 105 then monitors at least one power parameter in the power line (block 210). Power parameters may include, but are not limited to, rms voltage, rms current, voltage samples, current samples, watts, VARs, VAs, and the like or any combination thereof. The line mounted device 105 may timestamp the power parameters using time/position circuitry 120. In addition, the line mounted device 105 may determine a phase of the voltage and/or current in the power line 170. The phase of the voltage and/or current may be with respect to a reference such as the time from time/position circuitry 120 or may be with respect to the other of current and voltage. The line mounted device 105 may comprise an active current transformer as described in U.S. patent application Ser. No. 10/803,411 entitled "POWER LINE SENSORS AND SYSTEMS INCORPORATING SAME" which is incorporated by reference herein.

The line mounted device 105 transmits the at least one power parameter using communications circuitry 130 to the microprocessor based device 160 (block 220). The microprocessor based device 160 may have a memory that enables it to store multiple values of the at least one power parameter. The microprocessor based device 160 also receives and stores power parameters from the legacy instrumentation. Over a time period (for example one hour, one day, one week, one month, one year, etc.) the microprocessor based device 160 compares the power parameters received from the line mounted device 105 with the power parameters received from the legacy instrumentation 180 (block 230). The time period may be selected such that the power line will transition through most or all of its normal range of operation. The utility operating the power line 170 may also cycle the power line 170 through a range of operating current, voltage levels, etc. This may be done by changing the routing of power within the grid, ramping up or down generators located on the grid, etc. The microprocessor based device 160 then produces compensation data that will facilitate correction of the power parameter measurement of the legacy instrumentation 180 (block 240). The compensation data is based, in one example, on the power parameters received from the line mounted device 105, the power parameters received from the legacy instrumentation 180, and/or a comparison of these power parameters.

The correction of the power parameters received from or generated by the legacy instrumentation may occur in several ways. The microprocessor based device 160 may receive the power parameter measurements of the legacy instrumentation 180 and produce corrected measurements using the compensation data. This may be accomplished using algorithms similar to those described in U.S. Pat. No. 6,671,635 entitled "Systems for Improved Monitoring Accuracy of Intelligent Electronic Devices" which is incorporated by reference herein. In another embodiment, the legacy instrumentation 180 may already contain correction algorithms in which case the legacy instrumentation 180 may be configured to use the new compensation data generated by the microprocessor based device 160. This may be facilitated by an instrument transformer correction function such as described on pages Instr Xformer Correction (ITC) Module—1 to 5 in the document entitled "ION Reference" published in March 2004 by Power Measurement located in Saanichton, B. C., Canada which is incorporated by reference herein. The microprocessor based device 160 may alternatively or in addition corrects voltages and currents sample by sample, by phase, by power factor, using polynomial or other types of interpolation, using multiple calibration constants depending on load, based on temperature or humidity measurements, and the like or any combination thereof. The data transmitted from the line mounted device 105 to the microprocessor based device 160 may include data indicative of voltage, current or power in the time domain or frequency domain.

The correction of the power parameters may then be applied on an ongoing basis (block 250) and the line mounted device 105 may be removed (block 260) from the power line 170. Alternatively, the line mounted device 105 may be left on the power line 170.

Figure 3:
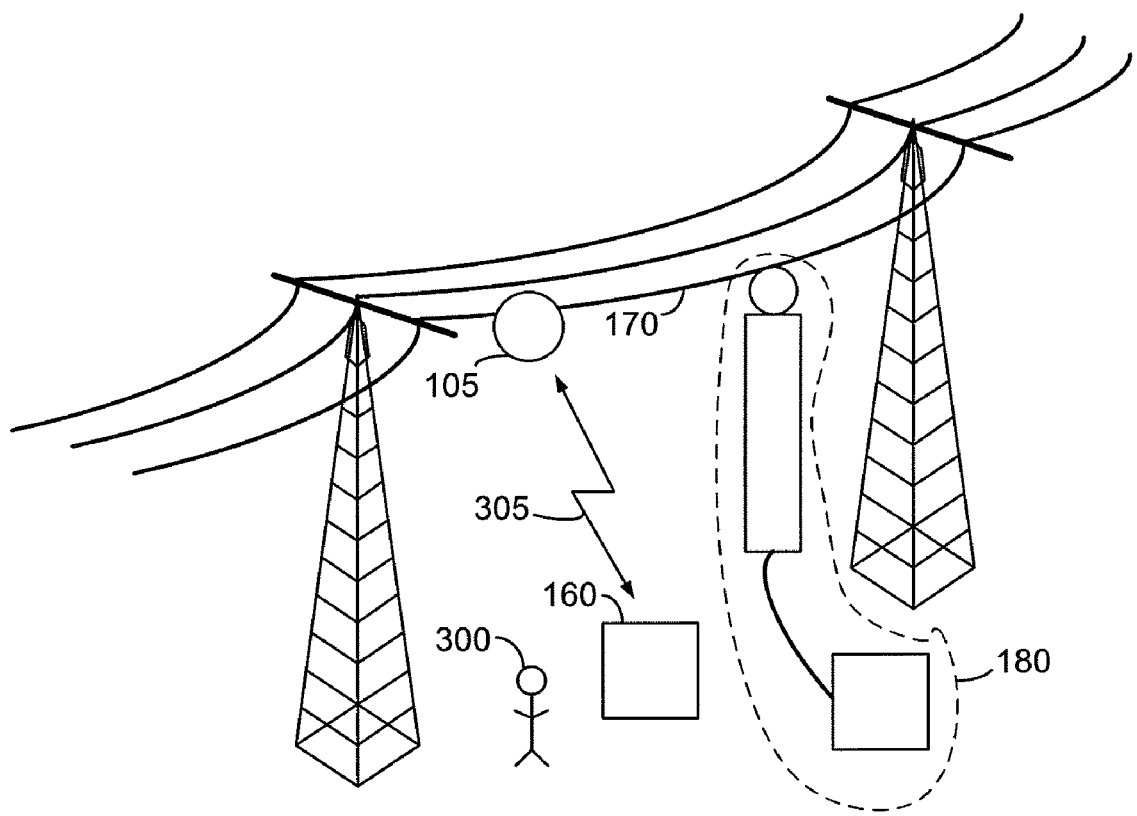
FIG. 3 depicts one embodiment of the apparatus in operation.

FIG. 3 depicts the reclassification apparatus 100 in operation. A line worker 300 tests the accuracy of legacy instrumentation 180 which is monitoring power in a power line 170 using the line mounted device 105. For example, the legacy instrumentation 180 may be an energy meter with current transformers coupled to the power line. In order to ensure the legacy instrumentation 180 is correctly calibrated or to compensate for inaccuracy in the legacy instrumentation 180, the line worker 300 attaches the line mounted device 105 to the power line 170, thereby allowing the line mounted device 105 to accurately monitor the power parameters in the power line over a period of time, such as 1 hour. A microprocessor device 160, such as a laptop computer or any other microprocessor based device, wirelessly couples 305 with the line mounted device 105 that has just been installed. As the line mounted device 105 monitors the power parameters in the power line 170, the information is transmitted either in real time, on demand, or on set intervals from the communications circuitry located in the line mounted device 105 to the microprocessor device 160. The information may include timestamps. In an alternate example, the line mounted device 105 contains memory circuitry to store time-stamped power parameter data which may be compared with power parameter data from the legacy instrumentation at a later time. Upon conclusion of the testing, or during the testing, the microprocessor based device compares the power parameter data as measured by the line mounted device 105 to the power parameter data as measured by the legacy instrumentation 180 and creates compensation data or characteristics for the legacy instrumentation 180 to utilize. As discussed earlier, the power parameter data may be time stamped to aid in the compensation characteristic calculations.

In another example, the legacy instrumentation 180 itself also acts as the microprocessor based device 160 and communicates to the line mounted device 105 through a wireless connection. In this example, the legacy instrumentation 180 performs and implements the compensation characteristic calculations. Alternately, data, that may include but is not limited to, power parameters, and/or compensation data or characteristics, is loaded into a first device 160, such as a portable energy meter, laptop or other portable computing device, and then transferred into the legacy instrumentation 180, ultimately allowing the legacy instrumentation 180 to perform the compensation characteristic calculations with its own microprocessor based on the power parameter data measurements of the line mounted device 105 and the power parameter data measurements of the legacy instrumentation 180.

In another example the line mounted device 105 incorporates wireless circuitry, such as cellular telephony circuitry, that enables it to communicate with the legacy instrumentation 180 to continue to compensate for the legacy instrumentation 180 measurement drift or error. In operation the line mounted device 105 is coupled to the power line 170 through methods known for attaching devices to power lines, such as a "hot stick". The line mounted device 105 then utilizes the wireless circuitry to communicate the sensor power parameter data to a microprocessor device 160, which also contains the legacy instrumentation 180 power parameter data. It can be appreciated that the microprocessor device 160 can be either an element of the legacy instrumentation 180 or a separate device. Next compensation characteristics for the legacy instrumentation 180 to utilize are created. Once the initial power parameters have been recalibrated for the legacy instrumentation 180, the line mounted device 105 periodically (such as weekly or monthly) sends new time stamped power parameter data to the microprocessor device 160, which checks for drift errors in the legacy instrumentation 180 power parameter data. When the drift exceeds a predetermined threshold, such as 0.2%, 2%, etc. error, then new compensation characteristics are calculated by the microprocessor device 160.

The sensor 150, may contain a limitation for the time or number of uses that it can be used before it ceases operation. Given the large cost savings the reclassification apparatus 100 can facilitate, it may be advantageous for the manufacturer of the reclassification apparatus 100 to limit or control the use of the reclassification apparatus 100, and thus be in the position to charge on a per use basis, instead of for the one time sale of the reclassification apparatus 100. In a first example for limiting the use of a sensor or of the line mounted device 105 may contain a security module 122 coupled to the microprocessor which controls the power parameter collection from the sensor 150 and power line 170. It can be appreciated that the security module can be a hardware security module requiring a hardware key, such as a dongle type key, or a software key requiring a user communicate an activation code to the line mounted device 105, through its communication circuitry 130. In a second example the security module 122 limits the use of the line mounted device 105 based on time. For example the line mounted device 105 may only measure the power parameters on the power line 170 for a period of 30 days before it needs to be reset either at the factory, or through another automated reset method dictated by the security module 122 as described above. Alternatively, the reclassification apparatus 100 or line mounted device 105 may operate only for a fixed number of reclassification cycles (such as an integer multiple of 3 for 3 phase systems). In a third example the security module 122 encrypts the power parameter data before transmitting it using the communications circuitry 130, thereby requiring the recipient to have the decryption key. It can be appreciated that this encryption may be rotated on a per-use basis of the device and the new decryption key may be reacquired from the manufacturer for every subsequent use. The security module 122 may be implemented through appropriate code executing on the processor 110.

The line mounted device 105 or reclassification apparatus 100 may communicate through appropriate networks such as the Internet, satellite, and or cellular telephone networks to a central server. The central server may also receive readings from the legacy instrumentation 180. The central server may thus generate compensation data or characteristics to be returned to the legacy instrumentation 180. Alternatively, the central server may continue to receive readings from the legacy instrumentation 180 and generate compensated readings. These readings may be returned by appropriate networks to the owner of the legacy instrumentation 180. In this scenario, the central server may be located at a facility owned by the provider of the reclassification apparatus 100 or another service provider. It will be appreciated that the central server may implement the security mechanisms previously described by for instance, only providing the compensation data for a fixed period of time from a given reclassification apparatus 100 or line mounted device 105 to the customer or legacy instrumentation 180.

It will be clear that various modification to the foregoing detailed description of the invention are possible without departing from the spirit and scope of the invention. For instance, the functionality of the microprocessor device 160 may be integrated into the sensor 105 or the legacy instrumentation 180. In addition, the sensor may retrieve data from the legacy instrumentation 180 over a wireless or other appropriate link and produce compensation data that is immediately or later incorporated into the legacy instrumentation 180 calculations. The legacy instrumentation 180 or microprocessor device 160 may comprise time circuitry to receive a time reference from a GPS satellite, cellular phone network, etc. This time reference may be synchronized with the time reference received by time/position circuitry 120. This time reference may be used to associate time with measurements, calculations, etc. generated by the legacy instrumentation 180 or microprocessor device 160.

It is therefore intended that the foregoing detailed description be regarded as illustrative rather than limiting, and that it be understood that it is the following claims, including all equivalents, that are intended to define the spirit and scope of this invention.

What is claimed is:

1. A system comprising:
    a line device, coupled to the power line, that monitors at least one power parameter of the power line;
    a microprocessor based device that receives a first indication of the at least one power parameter from the line device and a second indication of the at least one power parameter of the power line from legacy instrumentation coupled to the power line;
    wherein the microprocessor based device compares the first indication of the at least one power parameter from the line device and the second indication of the at least one power parameter from the legacy instrumentation at substantially the same time period as the second indication of the at least one power parameter, yielding comparison data, wherein the comparison data shows accuracy of measurement of the at least one power parameter by the legacy instrumentation.

2. The system of claim 1, wherein the line device further comprises: a sensor interfacing with the power line and producing one or more data indicative of the at least one power parameter; a processor coupled with the sensor and producing the indication of the at least one power parameter from the one or more data; and communication circuitry coupled with the processor to communicate the indication of the at least one power parameter to the microprocessor based device, wherein, prior to the line device being coupled to the power line, the legacy instrumentation has already been installed and has been monitoring the power line such that the second indication can be erroneous due to age of the legacy instrumentation, deterioration of the legacy instrumentation, or operating range of the legacy instrumentation.

3. The system of claim 2, wherein the sensor further comprises a split core enabling the sensor to be clamped along a longitudinal axis of the power line.

4. The system of claim 2, wherein the communication circuitry further comprises a wireless communication circuit.

5. The system of claim 1, wherein the system further comprises memory, coupled to the processor, that stores a plurality of the one or more data; and wherein the processor communicates the plurality of the at least one data indicative of the at least one power parameter to the microprocessor based device.

6. The system of claim 1, wherein the line device is powered by at least one battery.

7. The system of claim 1, wherein the line device is powered by the electric power line.

8. The system of claim 1, wherein one of the at least one power parameter is current flow in the electric power line.

9. The system of claim 1, wherein the line device further comprises time circuitry coupled to the line device, the time circuitry receiving time data from a time source, and wherein the line device associates the time data with the at least one power parameter.

10. The system of claim 1, wherein the line device further comprises position circuitry coupled to the line device, the position circuitry receiving position data, and wherein the line device associates the position data with the at least one power parameter.

11. The system of claim 1, wherein the line device monitors the power parameter over a normal range of operation of the legacy instrumentation and stores at least the first indication within memory on the line device.

12. An apparatus comprising:
   a line device coupled with a power line and producing at least one representation of a power parameter of the power line;
   a processor coupled to the line device and receiving the at least one representation and producing at least one modified representation thereof;
   communication circuitry coupled to the processor and communicating the at least one modified representation to a microprocessor based device;
   wherein the microprocessor based device tests the accuracy of legacy instrumentation coupled to the power line by comparing the at least one modified representation to a measurement of at least one power parameter of the power line taken by the legacy instrumentation.

13. The apparatus of claim 12, wherein the line device monitors the power parameter over a normal range of operation of the legacy instrumentation and stores the at least one representation within memory on the line device.

14. The apparatus of claim 12, further comprising time circuitry coupled to the processor, the time circuitry receiving time data from a time source, wherein the processor associates the time data with the at least one modified representation.

15. The apparatus of claim 12, further comprising position circuitry coupled to the processor, the position circuitry receiving position data, wherein the processor associates the position data with the at least one modified representation.

16. The apparatus of claim 12, wherein the line device is powered by at least one battery.

17. The apparatus of claim 12, wherein the line device is powered by the electric power line.

18. The apparatus of claim 12, the line device further comprising a split core sensor enabling the line device to be clamped along a longitudinal axis of the power line.

19. The apparatus of claim 12, wherein the communication circuitry further comprises a wireless communication circuit.

20. A method comprising the steps of:
   monitoring, by a line device, at least one power parameter of an electric power line and producing at least one representation thereof;
   communicating the at least one representation to a microprocessor based device; and
   comparing the representation with a measurement of the at least one power parameter of the power line produced by legacy instrumentation coupled to the power line.

21. The method of claim 20, further comprising the step of uncoupling the line device from the power line after monitoring the at least one parameter over a normal range of operation of the legacy instrumentation.

22. The method of claim 20, wherein the step of monitoring further comprises:
   producing at least one sample indicative of at least one of a voltage and a current in the power line; and
   associating a timestamp with each sample.

23. The method of claim 20, wherein the step of communicating comprises utilizing at least one wireless communication circuit.

24. The method of claim 20, further comprising:
   coupling the line device to the power line after the legacy instrumentation has already been installed and has been monitoring the power line such that the measurement can be erroneous due to age of the legacy instrumentation, deterioration of the legacy instrumentation, or operating range of the legacy instrumentation;
   responsive to the comparing producing a difference between the representation and the measurement, correcting the measurement to produce a corrected measurement; and
   responsive to the correcting, decoupling the line device from the power line while the legacy instrumentation remains coupled to the power line after the comparing.

* * * * *